United States Patent
Koo et al.

(10) Patent No.: US 9,590,202 B2
(45) Date of Patent: Mar. 7, 2017

(54) ORGANIC LIGHT EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventors: Youngmo Koo, Yongin (KR); Woongsik Kim, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 14/801,009

(22) Filed: Jul. 16, 2015

(65) Prior Publication Data

US 2016/0190505 A1   Jun. 30, 2016

(30) Foreign Application Priority Data

Dec. 29, 2014  (KR) .................. 10-2014-0192111

(51) Int. Cl.
*H01L 51/52*   (2006.01)

(52) U.S. Cl.
CPC ........ *H01L 51/5228* (2013.01); *H01L 51/525* (2013.01)

(58) Field of Classification Search
CPC .............. H01L 51/5228; H01L 51/525; H01L 51/5262; H01L 51/5271; H01L 51/5284; H01L 27/32; H01L 27/322; H01L 27/3248

See application file for complete search history.

(56) References Cited

U.S. PATENT DOCUMENTS

2014/0023778 A1    1/2014  Sung et al.
2014/0367651 A1*  12/2014  Song ................... H01L 51/5228
                                                              257/40

FOREIGN PATENT DOCUMENTS

| KR | 10-2005-0020330 A | 3/2005 |
|----|-------------------|--------|
| KR | 10-2008-0059723 A | 7/2008 |
| KR | 10-2009-0002717 A | 1/2009 |
| KR | 10-2010-0010750 A | 2/2010 |
| KR | 10-2011-0035049 A | 4/2011 |
| KR | 10-2012-0058102 A | 6/2012 |
| KR | 10-2013-0056003 A | 5/2013 |

* cited by examiner

*Primary Examiner* — Kyoung Lee
(74) *Attorney, Agent, or Firm* — Lee & Morse, P.C.

(57) ABSTRACT

An organic light emitting display device includes a first substrate, a first electrode layer including a plurality of first electrodes and an auxiliary electrode on the first substrate, the auxiliary electrode being spaced apart from the first electrodes in a plan view, an organic layer on the first electrode layer, the organic layer overlapping the first electrodes of the first electrode layer, a second electrode layer on the first electrode layer, the second electrode layer overlapping the first electrodes and the auxiliary electrode of the first electrode layer, a second substrate on the second electrode layer, and a connection member penetrating through the second electrode layer and through the organic layer to electrically connect the second electrode layer and the auxiliary electrode, the connection member contacting the second substrate.

14 Claims, 12 Drawing Sheets

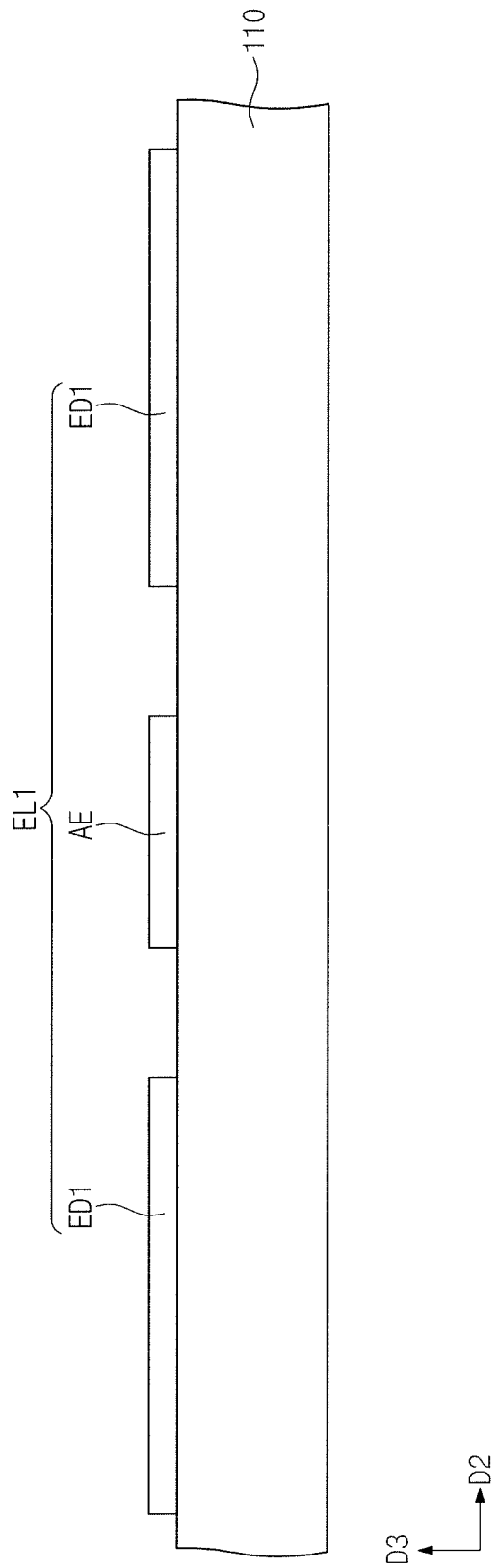

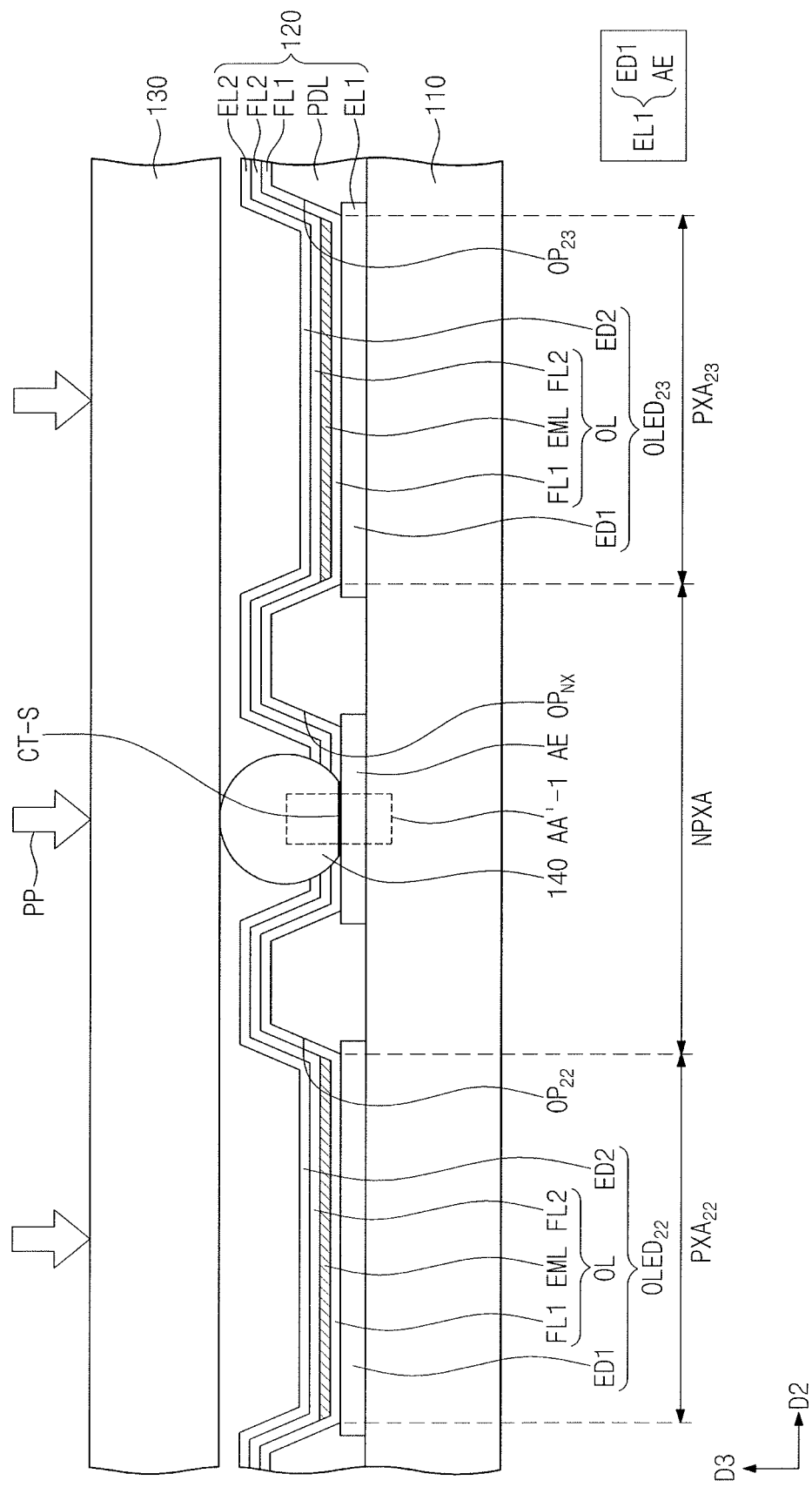

ORGANIC LIGHT EMITTING DISPLAY DEVICE AND METHOD OF MANUFACTURING THE SAME

CROSS-REFERENCE TO RELATED APPLICATION

Korean Patent Application No. 10-2014-0192111, filed on Dec. 29, 2014, in the Korean Intellectual Property Office, and entitled: "Organic Light Emitting Display Device and Method Of Manufacturing The Same," is incorporated by reference herein in its entirety.

BACKGROUND

1. Field

The present disclosure relates to an organic light emitting display device and a method of manufacturing the same. More particularly, the present disclosure relates to an organic light emitting display device having improved display quality and a method of manufacturing the organic light emitting diode display device.

2. Description of the Related Art

In recent years, an organic light emitting display device has been spotlighted as a flat panel display device. In general, the organic light emitting display device includes an organic light emitting layer, a first electrode disposed under the organic light emitting layer, and a second electrode disposed on the organic light emitting layer. The organic light emitting display device causes a difference in electric potential between the first and second electrodes to allow the organic light emitting layer to emit light, and displays an image using the light.

The organic light emitting display device is classified into a front surface light emitting type and a rear surface light emitting type. In the front surface light emitting type organic light emitting display device, the light emitted from the organic light emitting layer travels to the outside of the organic light emitting display device after passing through the second electrode, and in the rear surface light emitting type organic light emitting display device, the light emitted from the organic light emitting layer travels to the outside of the organic light emitting display device after being reflected by the second electrode.

SUMMARY

The present disclosure provides an organic light emitting display device capable of reducing surface resistance of a second electrode and improving a display quality of an image.

The present disclosure provides a method of manufacturing the organic light emitting display device, which is capable of simplifying a manufacturing process of the organic light emitting display device.

Embodiments provide an organic light emitting display device including a first substrate, a first electrode layer including a plurality of first electrodes disposed on the first substrate and an auxiliary electrode spaced apart from the first electrodes in a plan view, an organic layer disposed on the first electrode layer to overlap with the first electrodes, a second electrode layer disposed on the first electrode layer to overlap with the first electrodes and the auxiliary electrode, a second substrate disposed on the second electrode layer, and a connection member penetrating through the second electrode layer and the organic layer to electrically connect the second electrode layer and the auxiliary electrode. The connection member contacts the second substrate.

The connection member makes contact with the auxiliary electrode.

The connection member has a substantially spherical shape.

The organic light emitting display device further includes a pixel definition layer disposed between the first electrode layer and the organic layer and provided with a plurality of opening portions spaced apart from each other in a plan view.

The opening portions include a plurality of first openings respectively exposing at least portions of the first electrodes and a second opening portion spaced apart from the first electrodes in a plan view and exposing at least a portion of the auxiliary electrode, and the connection member may be disposed in the second opening portion.

Each of the connection member and the second opening portion may be provided in a plural number and one or more connection members are disposed in each of the second opening portions.

The first opening portions are arranged in a matrix form in a plan view and the second opening portion may be disposed between the first portions to have a lattice shape.

The organic layer includes a hole transport region overlapped with the first electrodes and the auxiliary electrode, a plurality of light emitting patterns respectively overlapped with the first electrodes, and an electron transport region overlapped with the first electrodes and the auxiliary electrode.

The connection member penetrates through at least one of the hole transport region and the electron transport region and is spaced apart from the light emitting patterns in a plan view.

The first electrodes receive a first source voltage and the auxiliary electrode receives a second source voltage different from the first source voltage.

The auxiliary electrode includes a substantially same material as the first electrodes.

The organic light emitting display device further includes a sealing member disposed between the first substrate and the second substrate along an edge of the second substrate to couple the first substrate and the second substrate and a filling agent interposed between the first substrate and the second substrate.

Embodiments provide a method of manufacturing an organic light emitting display device, including providing a first substrate comprising a plurality of light emitting areas and a non-light emitting area disposed adjacent to the light emitting areas, forming a plurality of first electrodes respectively disposed in the light emitting areas of the first substrate and at least one auxiliary electrode disposed in the non-light emitting area of the first substrate, forming a pixel definition layer on the first substrate to expose at least a portion of each of the first electrodes and the auxiliary electrode, forming an organic layer on the first substrate, forming a second electrode on the organic layer, disposing a connection member on the second electrode to overlap with the non-light emitting area, disposing a second substrate above the second electrode, pressurizing the second substrate to allow the connection member to electrically contact the auxiliary electrode, and coupling the first substrate and the second substrate.

The forming of the pixel definition layer includes forming an insulating layer on the first substrate to cover the first electrodes and the auxiliary electrode and forming first opening portions through the insulating layer to expose the first electrodes and a second opening portion through the insulating layer to expose the auxiliary electrode. The connection member is provided in the second opening portion.

The connection member is a conductive ball.

The connection member is pressurized by the second substrate, and a height in a cross-sectional view of the connection member after the connection member is pressurized by the second substrate is equal to or smaller than a height in the cross-sectional view of the connection member before the connection member is pressurized by the second substrate.

The forming of the organic layer includes forming a hole transport region on the first electrode layer, forming a plurality of light emitting patterns on the hole transport region to respectively overlap with the light emitting areas, and forming an electron transport region on the light emitting patterns and the hole transport region, the connection member disposed to be spaced apart from the light emitting patterns in a plan view. The connection member penetrates through at least one of the hole transport region and the electron transport region by the pressurization of the second substrate to contact the auxiliary electrode.

BRIEF DESCRIPTION OF THE DRAWINGS

Features will become apparent to those of ordinary skill in the art by describing in detail exemplary embodiments with reference to the attached drawings. in which:

FIGS. 5A to 5G illustrate cross-sectional views of stages in a method of manufacturing an organic light emitting display device according to an exemplary embodiment of the present disclosure.

DETAILED DESCRIPTION

Figure 1:
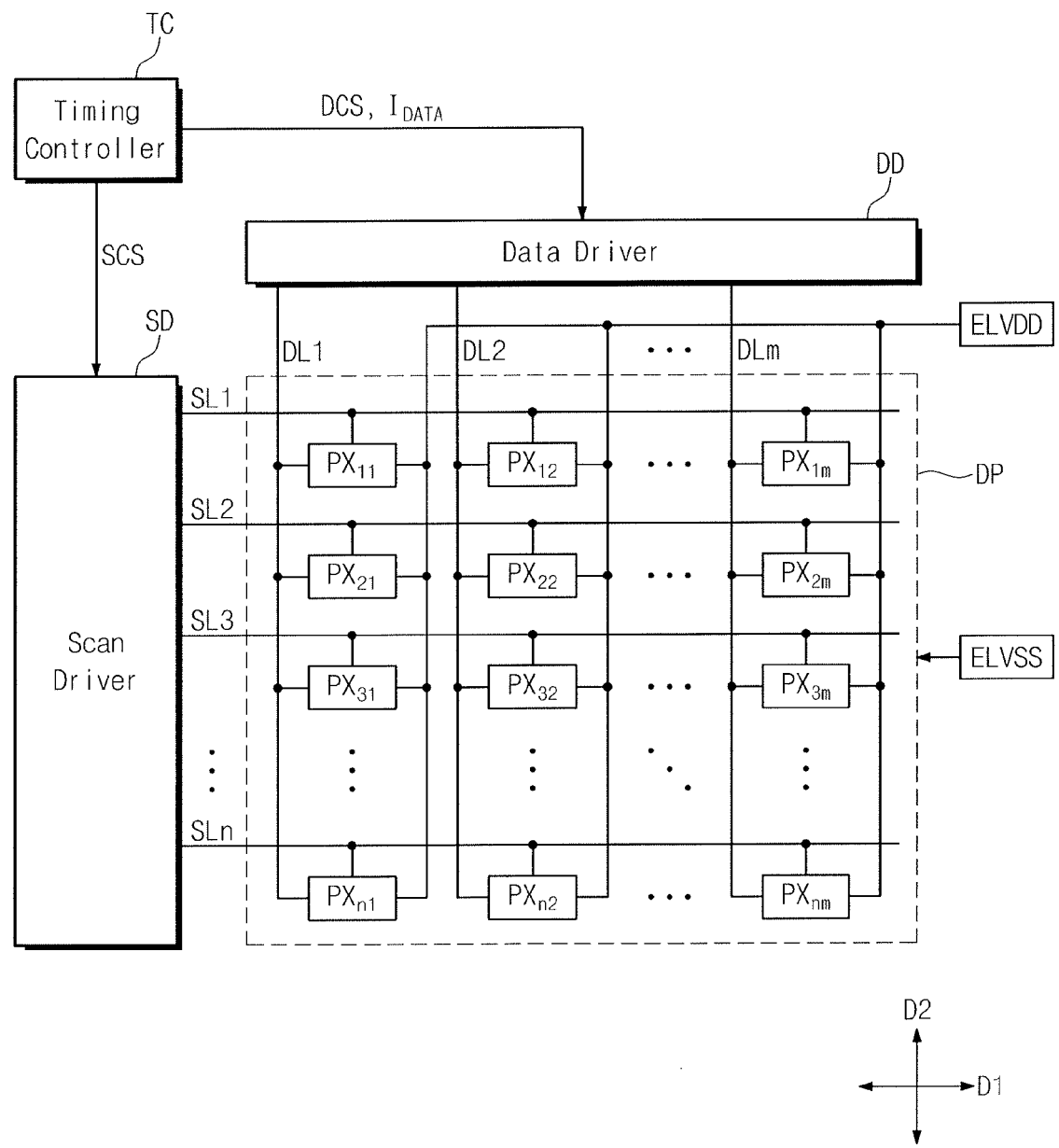
FIG. 1 illustrates a block diagram of an organic light emitting display device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers, elements, and regions may be exaggerated for clarity of illustration. It will also be understood that when a layer or element is referred to as being "on," "connected to," or "coupled to" another layer or element, it can be directly on, connected to, or coupled to the other layer or element, or intervening layers or elements may also be present. In addition, it will also be understood that when an element, e.g., layer, is referred to as being "between" two elements, it can be the only element between the two elements, or one or more intervening elements may also be present. Like reference numerals refer to like elements throughout.

As used herein, the term "and/or" includes any and all combinations of one or more of the associated listed items. Further, it will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

Figure 2:
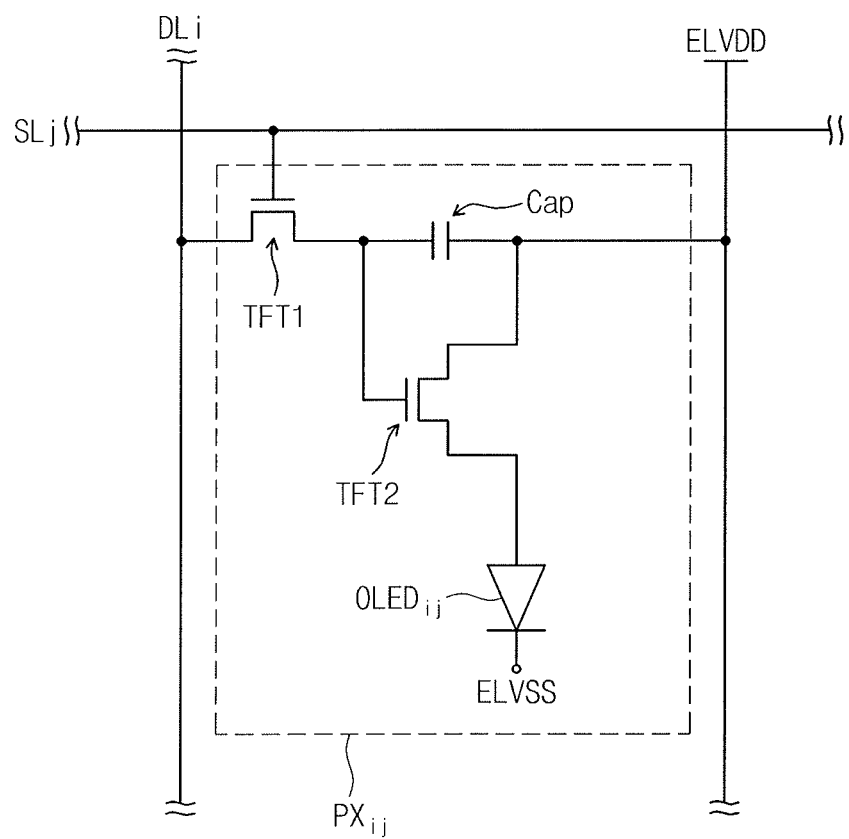
FIG. 2 illustrates an equivalent circuit diagram showing a pixel in FIG. 1.

FIG. 1 illustrates a block diagram showing an organic light emitting display device according to an exemplary embodiment of the present disclosure. FIG. 2 illustrates an equivalent circuit diagram showing a pixel in FIG. 1.

Referring to FIGS. 1 and 2, an organic light emitting display device may include a timing controller TC, a gate driver GD, a data driver DD, and an organic light emitting display panel DP (hereinafter, referred to as a display panel).

The timing controller TC receives input image signals and outputs image data $I_{DATA}$ obtained by converting the input image signals in consideration of an operation mode of the display panel DP, and various control signals GCS and DCS.

The gate driver GD receives a gate driving control signal GCS from the timing controller TC. The gate driver GD generates a plurality of gate signals in response to the gate driving control signal GCS. The gate signals are sequentially applied to the display panel DP.

The data driver DD receives a data driving control signal DCS and the image data $I_{DATA}$ from the timing controller TC. The data driver DD generates a plurality of data signals on the basis of the data driving control signal DCS and the image data $I_{DATA}$. Data signals are supplied to the display panel DP.

The display panel DP receives electrical signals from an external source to display an image. The display panel DP includes a plurality of gate lines GL1 to GLn, a plurality of data lines DL1 to DLm, and a plurality of pixels $PX_{11}$ to $PX_{nm}$.

The gate lines GL1 to GLn extend in a first direction D1, and are arranged in a second direction D2 crossing the first direction D1. The gate lines GL1 to GLn sequentially receive the gate signals from the gate driver GD.

The data lines DL1 to DLm are insulated from the gate lines GL1 to GLn while crossing the gate lines GL1 to GLn. The data lines DL1 to DLm extend in the second direction D2, and are arranged in the first direction D1. The data lines DL1 to DLm receive the data signals from the data driver DD.

The display panel DP receives a first source voltage ELVDD and a second source voltage ELVSS. Each of the pixels $PX_{11}$ to $PX_{nm}$ is turned on in response to a corresponding gate signal of the gate signals. Each of the pixels $PX_{11}$ to $PX_{nm}$ receives the first and second source voltages ELVDD and ELVSS and generates light in response to a corresponding data signal of the data signals. The first source voltage ELVDD has a voltage level higher than that of the second source voltage ELVSS.

The pixels $PX_{11}$ to $PX_{nm}$ are arranged in a matrix form. Each of the pixels PX11 to PXnm is connected to a corresponding gate line of the gate lines GL1 to GLn and a corresponding data line of the data lines DL1 to DLm.

Each of the pixels $PX_{11}$ to $PX_{nm}$ receives the gate signal through the corresponding gate line and the data signal through the corresponding data line. Each of the pixels $PX_{11}$ to $PX_{nm}$ is turned on in response to the corresponding gate signal and generates the light in response to the corresponding data signal to display the image.

Each of the pixels $PX_{11}$ to $PX_{nm}$ includes at least one transistor, at least one capacitor, and an organic light emitting device. FIG. 2 shows the equivalent circuit diagram of a pixel $PX_{ij}$ connected to an i-th gate line GLi of the gate lines GL1 to GLn and a j-th data line DLj of the data lines DL1 to DLm.

The pixel $PX_{ij}$ includes a first thin film transistor TFT1, a second thin film transistor TFT2, a capacitor Cap, and an organic light emitting device OLEDij. The first thin film transistor TFT1 includes a control electrode connected to the i-th gate line GLi, an input electrode connected to the j-th data line DLj, and an output electrode. The first thin film transistor TFT1 outputs the data signal applied to the j-th data line DLj in response to the scan signal applied to the i-th gate line GLi.

The capacitor Cap includes a first capacitor electrode connected to the first thin film transistor TFT1 and a second capacitor electrode applied with the first source voltage ELVDD. The capacitor Cap is charged with electric charges corresponding to a difference between a voltage corresponding to the data signal provided from the first thin film transistor TFT1 and the first source voltage ELVDD.

The second thin film transistor TFT2 includes a control electrode connected to the output electrode of the first thin film transistor TFT1 and the first capacitor electrode of the capacitor Cap, an input electrode applied with the first source voltage ELVDD, and an output electrode. The output electrode of the second thin film transistor TFT2 is connected to the organic light emitting device $OLED_{ij}$.

The second thin film transistor TFT2 controls a driving current flowing through the organic light emitting device $OLED_{ij}$ to correspond to the electric charges charged in the capacitor Cap. A turned-on time duration of the second thin film transistor TFT2 is determined depending on an amount of the electric charges charged in the capacitor Cap. The output electrode of the second thin film transistor TFT2 applies a voltage lower than the first source voltage ELVDD to the organic light emitting device $OLED_{ij}$.

The organic light emitting device OLEDij includes a first electrode connected to the second thin film transistor TFT2 and a second electrode applied with the second source voltage ELVSS. The organic light emitting device OLEDij includes a light emitting pattern disposed between the first and second electrodes.

The organic light emitting device $OLED_{ij}$ emits the light during the turned-on period of the second thin film transistor TFT2. The light emitted from the organic light emitting device $OLED_{ij}$ has a color determined by a material of the light emitting pattern. For instance, the color of the light emitted from the organic light emitting device $OLED_{ij}$ may be one of red, green, blue, and white colors.

Figure 3A:
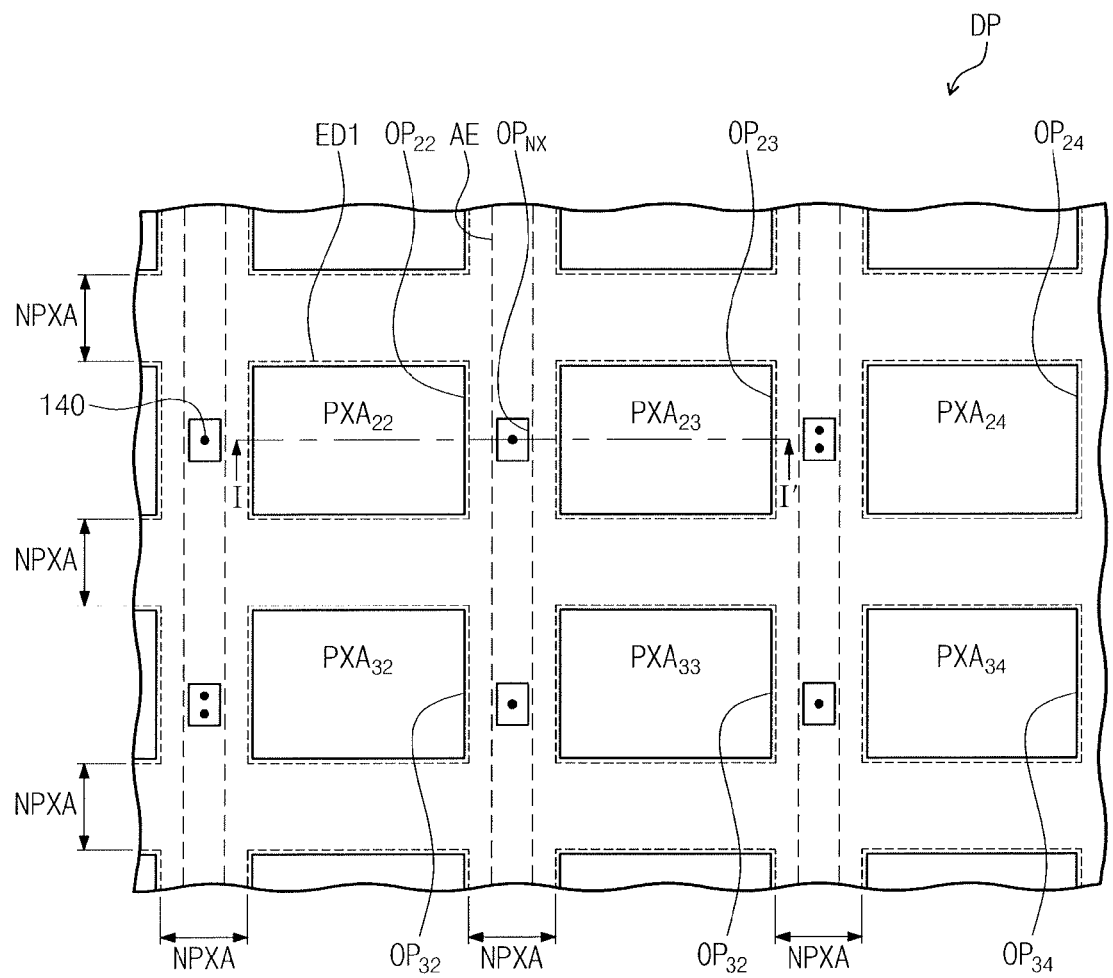
FIG. 3A illustrates a plan view of a portion of an organic light emitting display panel according to an exemplary embodiment of the present disclosure.
Figure 3B:
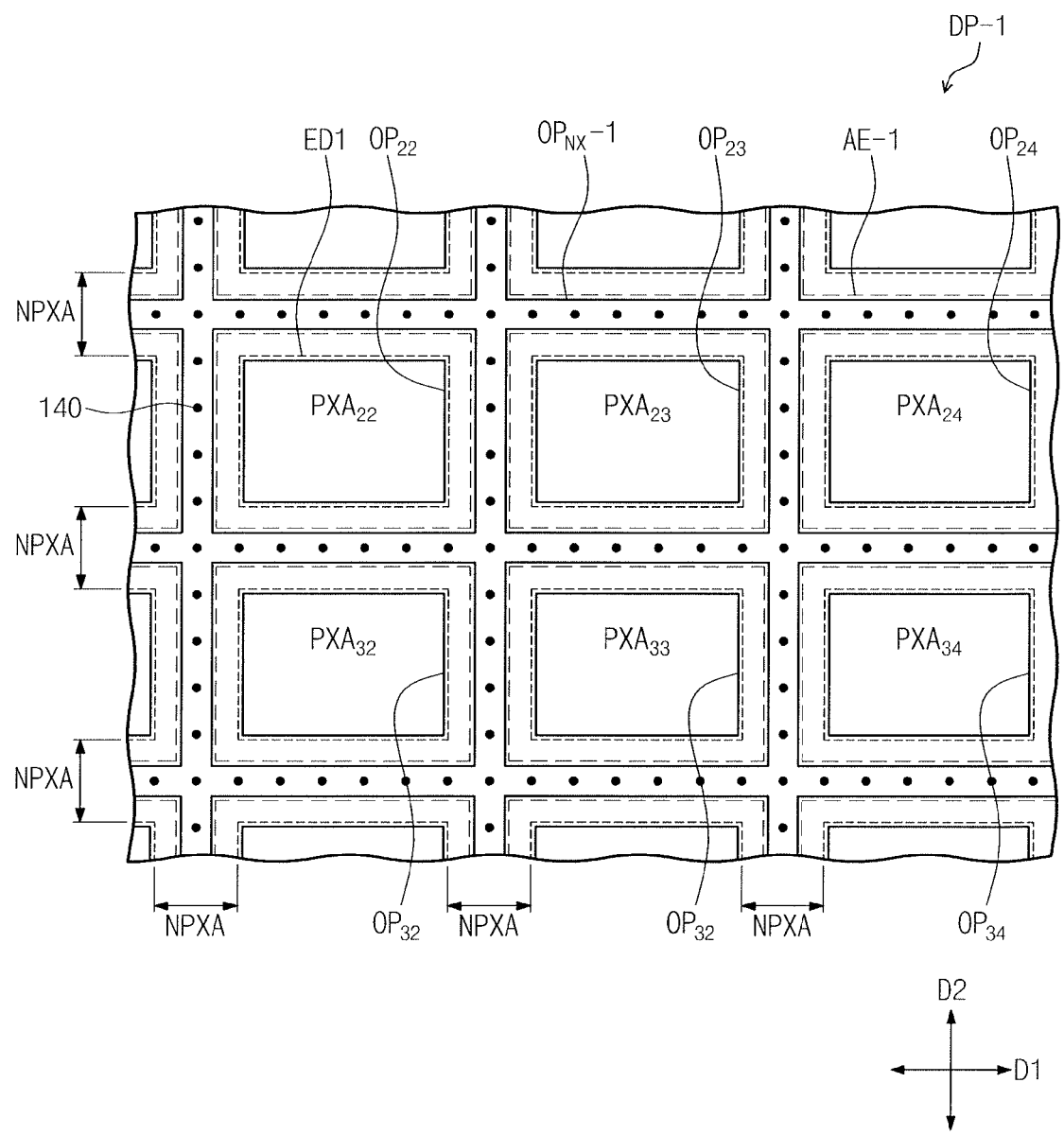
FIG. 3B illustrates a plan view of a portion of an organic light emitting display panel according to an exemplary embodiment of the present disclosure.
Figure 4:
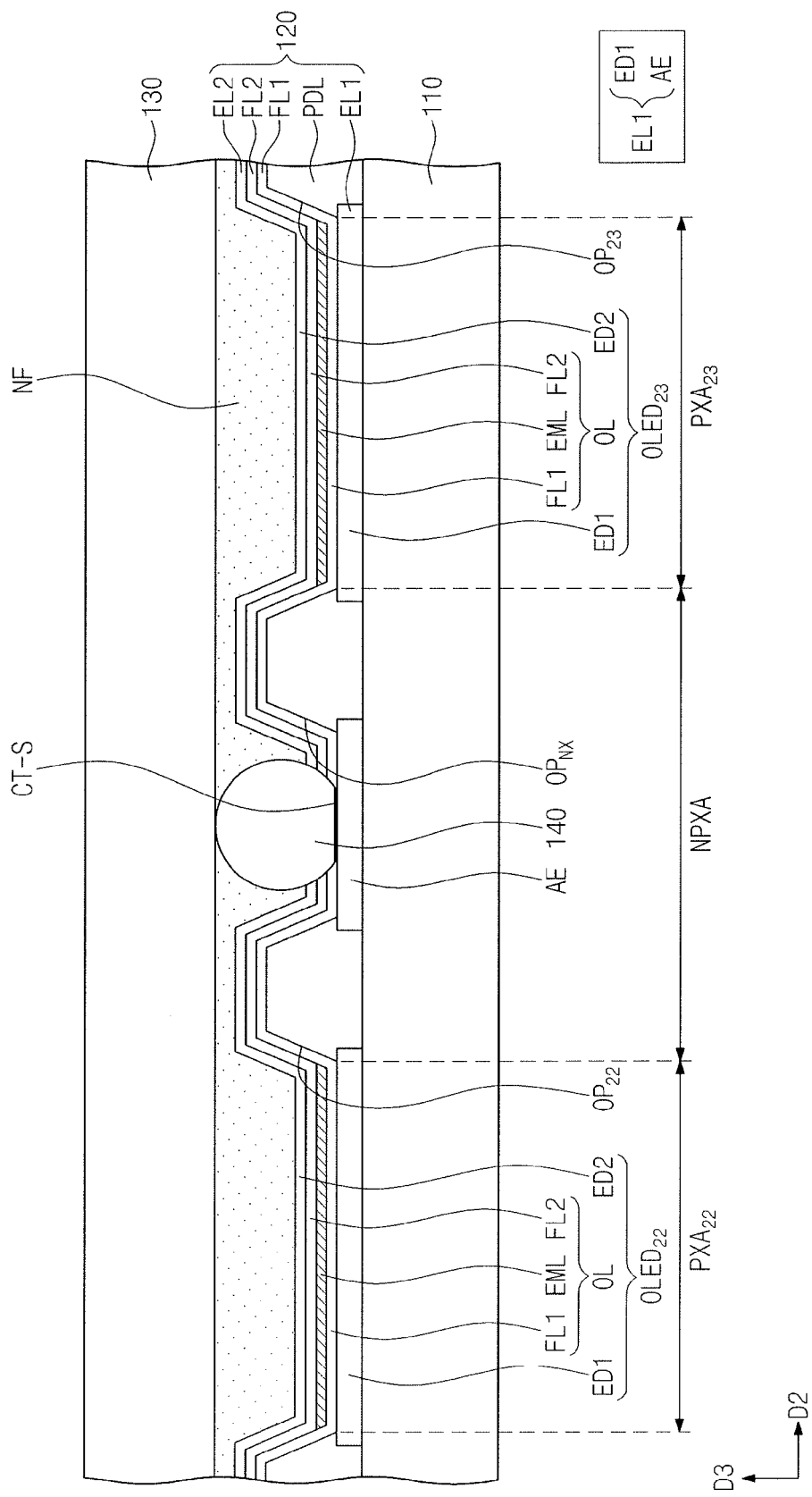
FIG. 4 illustrates a cross-sectional view taken along line I-I' of FIG. 3A.

FIG. 3A illustrates a plan view showing a portion of an organic light emitting display panel according to an exemplary embodiment of the present disclosure, FIG. 3B is a plan view showing a portion of an organic light emitting display panel according to another exemplary embodiment of the present disclosure, and FIG. 4 is a cross-sectional view taken along line I-I' of FIG. 3A. In FIGS. 3A, 3B, and 4, the same reference numerals denote the same elements in FIGS. 1 and 2, and thus detailed descriptions of the same elements will be omitted.

Referring to FIGS. 3A-4, the display panel DP may include a first substrate 110, a device layer 120, a second substrate 130, and a connection member 140. The first substrate 110 may be, but is not limited to, an insulating substrate, e.g., a glass substrate, a plastic substrate, etc.

Although not shown in figures, the first substrate 110 includes a plurality of thin film layers sequentially stacked on one on anther. The thin film layers may include an organic layer and/or an inorganic layer. In the present exemplary embodiment, the thin film layers include the thin film transistors TFT1 and TFT2 and the capacitor Cap, which are shown in FIG. 2.

As illustrated in FIG. 3A, the first substrate 110 may include a plurality of light emitting areas and a non-light emitting area disposed adjacent to the light emitting areas, e.g., light emitting areas $PXA_{22}$, $PXA_{23}$, $PXA_{24}$, $PXA_{32}$, $PXA_{33}$, and $PXA_{34}$. The light emitting areas $PXA_{22}$, $PXA_{23}$, $PXA_{24}$, $PXA_{32}$, $PXA_{33}$, and $PXA_{34}$ are spaced apart from each other, such that the non-light emitting area NPXA is disposed therebetween. The light emitting areas $PXA_{22}$, $PXA_{23}$, $PXA_{24}$, $PXA_{32}$, $PXA_{33}$, and $PXA_{34}$ are arranged in various arrangements. For instance, the light emitting areas $PXA_{22}$, $PXA_{23}$, $PXA_{24}$, $PXA_{32}$, $PXA_{33}$, and $PXA_{34}$ may be arranged in a matrix form as shown in FIG. 3A, but they are not limited thereto or thereby. Accordingly, the non-light emitting area NPXA has a substantial lattice shape.

Referring back to FIG. 4, the device layer 120 is disposed above the first substrate 110 in a third direction D3. The device layer 120 includes a first electrode layer EL1, a pixel definition layer PDL, an organic layer OL, and a second electrode layer EL2.

The first electrode layer EL1 is disposed on the first substrate 110. The first electrode layer EL1 includes a plurality of first electrodes ED1 and at least one auxiliary electrode AE. The first electrodes ED1 and the auxiliary electrode AE are disposed on the same layer. The first electrodes ED1 and the auxiliary electrode AE are spaced apart from each other on a plane surface defined by the first and second directions D1 and D2.

The first electrodes ED1 are disposed to overlap with the light emitting areas $PXA_{22}$, $PXA_{23}$, $PXA_{24}$, $PXA_{32}$, $PXA_{33}$, and $PXA_{34}$, respectively. Although not shown in figures, each of the first electrodes ED1 includes a connection part (not shown) electrically connected to the second thin film transistor TFT2.

The auxiliary electrode AE is disposed to overlap with the non-light emitting area NPXA. The auxiliary electrode AE may have various shapes. For example, the auxiliary electrode AE may have a same lattice shape as that of the non-light emitting area NPXA. In another example, the auxiliary electrode AE may be provided in a plural number, so each of the auxiliary electrodes AE may have a substantial line shape elongated along the first direction D1 or the second direction D2.

FIGS. 3A and 3B illustrate the auxiliary electrodes having various shapes. For example, FIG. 3A shows the auxiliary electrodes AE elongated in the second direction D2 and arranged in the first direction D1 to be spaced apart from each other. In this case, each of the auxiliary electrodes AE has a line shape.

In another example, FIG. 3B illustrates an auxiliary electrode AE-1 having a lattice shape in plan view. The auxiliary electrode AE-1 is disposed between the first electrodes ED1 and not overlapped with the first electrodes ED1. However, the shape of the auxiliary electrode should not be limited to those shown in FIGS. 3A and 3B, as long as the auxiliary electrode is spaced apart from the first electrodes ED1 and overlapped with the non-light emitting area NPXA.

The first electrodes ED1 receive a voltage different from that applied to the auxiliary electrode AE. In the present exemplary embodiment, the first electrodes ED1 receive the first source voltage ELVDD (refer to FIG. 2) and the auxiliary electrode AE receives the second source voltage ELVSS (refer to FIG. 2).

Each of the first electrodes ED1 may be a reflective electrode or a transmissive electrode. When the organic light emitting display device is a front surface light emitting type, the first electrodes ED1 include a reflective metal, e.g., silver, gold, platinum, etc. When the organic light emitting display device is a rear surface light emitting type, the first electrodes ED1 include a transmissive metal, e.g., a transparent conductive oxide (TCO).

The auxiliary electrode AE is disposed between the first electrodes ED1 adjacent to each other. The auxiliary electrode AE is connected to a source voltage line to receive the second source voltage ELVSS.

The auxiliary electrode AE includes the same material as that of the first electrodes ED1. In addition, the auxiliary electrode AE and the first electrodes ED1 may be substantially and simultaneously formed. According to embodiments, the auxiliary electrode AE and the first electrodes ED1 may include different materials and may be sequentially formed.

The pixel definition layer PDL is disposed on the first electrode layer EL1. The pixel definition layer PDL defines the light emitting areas $PXA_{22}$, $PXA_{23}$, $PXA_{24}$, $PXA_{32}$, $PXA_{33}$, and $PXA_{34}$ and the non-light emitting area NPXA. The pixel definition layer PDL includes a plurality of openings formed therethrough. The openings include a plurality of first openings $OP_{22}$, $OP_{23}$, $OP_{24}$, $OP_{32}$, $OP_{33}$, and $OP_{34}$ and at least one second opening $OP_{NX}$.

The first openings $OP_{22}$, $OP_{23}$, $OP_{24}$, $OP_{32}$, $OP_{33}$, and $OP_{34}$ define the light emitting areas $PXA_{22}$, $PXA_{23}$, $PXA_{24}$, $PXA_{32}$, $PXA_{33}$, and $PXA_{34}$ and the non-light emitting area NPXA. Areas overlapped with the first openings $OP_{22}$, $OP_{23}$, $OP_{24}$, $OP_{32}$, $OP_{33}$, and $OP_{34}$ are defined as the light emitting areas $PXA_{22}$, $PXA_{23}$, $PXA_{24}$, $PXA_{32}$, $PXA_{33}$, and $PXA_{34}$, and an area not overlapped with the first openings $OP_{22}$, $OP_{23}$, $OP_{24}$, $OP_{32}$, $OP_{33}$, and $OP_{34}$ is defined as the non-light emitting area NPXA.

The first openings $OP_{22}$, $OP_{23}$, $OP_{24}$, $OP_{32}$, $OP_{33}$, and $OP_{34}$ are overlapped with the first electrodes ED1, respectively, to expose the first electrodes ED1. Light emitting patterns EML described later are disposed on the exposed first electrodes ED1, respectively.

The second opening $OP_{NX}$ is defined in the non-light emitting area NPXA. The second opening $OP_{NX}$ is overlapped with the auxiliary electrode AE to expose at least a portion of the auxiliary electrode AE. A connection member 140 described later is disposed on the exposed auxiliary electrode AE.

The second opening $OP_{NX}$ aligns a position of the connection member 140 to allow the connection member 140 to be stably disposed on the auxiliary electrode AE. The second opening $OP_{NX}$ prevents the connection member 140 from moving to adjacent light emitting areas or from being misaligned with the auxiliary electrode AE. Therefore, the connection member 140 is easily connected to the auxiliary electrode AE.

The second opening $OP_{NX}$ has various shapes in plan view. For instance, the second opening $OP_{NX}$ may have a circular, oval, or polygonal shape in the plan view. FIG. 3A shows the second opening $OP_{NX}$ having a substantially quadrangular shape. Although not shown in figures, the second opening $OP_{NX}$ may have a line shape elongated along the auxiliary electrode. In this case, the second opening $OP_{NX}$ exposes an entire surface of the auxiliary electrode.

As shown in FIG. 3B, a second opening portion $OP_{NX}$-1 may have a lattice shape. In this case, the second opening portion $OP_{NX}$-1 exposes an entire surface of the auxiliary electrode AE-1.

The second opening portion $OP_{NX}$-1 is disposed between the first openings $OP_{22}$, $OP_{23}$, $OP_{24}$, $OP_{32}$, $OP_{33}$, and $OP_{34}$, and is integrally formed as a single unitary and individual unit. The connection member 140 is provided in a plural number in the second opening portion $OP_{NX}$-1, e.g., the connection members 140 may be irregularly arranged in the second opening portion $OP_{NX}$-1. However, embodiments are not limited thereto or thereby.

The pixel definition layer PDL is overlapped with the non-light emitting area NPXA and exposes areas corresponding to the light emitting areas $PXA_{22}$, $PXA_{23}$, $PXA_{24}$, $PXA_{32}$, $PXA_{33}$, and $PXA_{34}$ of the first electrode layer EL1. In the present exemplary embodiment, the pixel definition layer PDL also exposes at least a portion of the auxiliary electrode AE. The connection member 140 is disposed on the auxiliary electrode AE exposed by the pixel definition layer PDL.

The organic layer OL is disposed on the pixel definition layer PDL. The organic layer OL includes the light emitting patterns EML, a hole transport region FL1 (or a hole control layer), and an electron transport region FL2 (or an electron control layer).

The light emitting patterns EML are disposed to respectively overlap with the light emitting areas $PXA_{22}$, $PXA_{23}$, $PXA_{24}$, $PXA_{32}$, $PXA_{33}$, and $PXA_{34}$. The light emitting patterns EML include an organic material.

In detail, each of the light emitting patterns EML includes at least one material of materials emitting red, green, and blue lights, a fluorescent material, or a phosphorescent material. The light emitting patterns EML may emit lights having different colors according to the light emitting areas $PXA_{22}$, $PXA_{23}$, $PXA_{24}$, $PXA_{32}$, $PXA_{33}$, and $PXA_{34}$.

In addition, the light emitting patterns EML may have a single-layer structure of a single material, a single-layer structure of different materials from each other, or a multi-layer structure of different materials from each other. Thus, each of the light emitting patterns EML emits light having at least one color of the red, green, and blue colors, or light having a color obtained by mixing at least two colors of the red, green, and blue colors.

The hole transport region FL1 is disposed on the first electrodes ED1 and the auxiliary electrode AE. The hole transport region FL1 is overlapped with the light emitting areas $PXA_{22}$, $PXA_{23}$, $PXA_{24}$, $PXA_{32}$, $PXA_{33}$, and $PXA_{34}$ and the non-light emitting area NPXA.

The hole transport region FL1 includes at least one of a hole injection layer, a hole transport layer, and a single layer having hole injection and transport functions. The hole transport region FL1 includes at least one of a hole injection material and a hole transport material. Each of the hole injection material and the hole transport material may be a material which is known in the art.

The hole transport region FL1 may further include a hole support layer. When the hole transport region FL1 includes the hole support layer, the hole transport region FL1 may include a hole block material which is known in the art. For instance, the hole transport region FL1 includes at least one of BCP(2,9-dimethyl-4,7-diphenyl-1,10-phenanthroline) and Bphen(4,7-diphenyl-1,10-phenanthroline), but it should not be limited thereto or thereby.

In addition, the hole transport region FL1 may further include an electric charge generating material. The electric charge generating material is uniformly distributed in the hole transport region FL1 to form a single unitary area or is non-uniformly distributed in the hole transport area FL1 to divide the hole transport region FL1 into plural areas.

The electron transport region FL2 is defined between a second electrode layer EL2 and the light emitting patterns EML. Electrons injected from the transport region second electrode layer EL2 reach to the light emitting patterns EML via the electron transport region FL2.

The electron transport region FL2 includes at least one of an electron transport material and an electron injection material. The electron transport region FL2 is an electron transport layer including the electron transport material or an electron injection/transport single layer including the electron transport material and the electron injection material.

The second electrode layer EL2 is disposed on the organic layer EL. The second electrode layer EL2 faces the first electrodes ED1. For instance, when the first electrodes ED1 are anode electrodes, the second electrode layer EL2 is a cathode electrode. Accordingly, the second electrode layer EL2 includes a material with a low work function to allow the electrons to be easily injected.

The second electrode layer EL2 includes a conductive material, e.g., a metal, an alloy, an electric conductive compound, or a mixture thereof. For instance, the second electrode layer EL2 includes at least one of reflective materials, e.g., lithium (Li), magnesium (Mg), aluminum (Al), aluminum-lithium (Al—Li), calcium (Ca), magnesium-indium (Mg—In), magnesium-silver (Mg—Ag), etc.

According to embodiments, the second electrode layer EL2 may include at least one of transmissive materials, e.g., indium tin oxide, indium zinc oxide, zinc oxide, indium tin zinc oxide, etc.

The second electrode layer EL2 may have a single-layer structure or a multi-layer structure. The multi-layer structure includes at least one of a layer including the reflective material and a layer including the transmissive material.

The second electrode layer EL2 may be a reflective, transflective, or transmissive electrode. The second electrode layer EL2 may include various materials according to the structure of the organic light emitting device.

In the case the organic light emitting display device is a front surface light emitting type, the second electrode layer EL2 has a thickness as thin as possible. As the thickness of the second electrode layer EL2 becomes thin, the lights generated by the light emitting patterns EML easily exit to the outside through the second electrode layer EL2 since the transmittance becomes high. Accordingly, the display quality of a front surface light emitting type organic light emitting display device is improved by forming the second electrode layer EL2 using the transparent conductive material or decreasing the thickness of the second electrode layer EL2.

However, as the second electrode layer EL2 becomes thin, the electric resistance of the second electrode layer EL2 becomes high. Therefore, the display quality of the organic light emitting display device may be deteriorated due to the lower of the electrical conductivity. Accordingly, in order to reduce resistance of the second electrode layer EL2, while maintaining low thickness thereof, the second electrode layer EL2 is connected to the auxiliary electrode AE via the connection member 140, as will be described in more detail below.

The second substrate 130 may be, but is not limited to, a transparent insulating substrate, e.g., a glass substrate, a plastic substrate, etc. In the present exemplary embodiment, the second substrate 130 may be, but is not limited to, an encapsulation substrate. Accordingly, the second substrate 130 and the device layer 120 are disposed to be spaced apart from each other, and a filling agent NF is filled in a gap between the second substrate 130 and the device layer 120. The filling agent NF prevents a foreign substance existing between the first and second substrates 110 and 130 from entering the organic light emitting device.

Although not shown in figures, a plurality of thin film layers may be disposed on the second substrate 130. For instance, a plurality of touch cells including a plurality of touch patterns is disposed on the second substrate 130.

The connection member 140 is disposed between the first substrate 110 and the second substrate 130. The connection member 140 electrically connects the auxiliary electrode AE and the second electrode layer EL2.

The connection member 140 is disposed to overlap with the non-light emitting area NPXA. The connection member 140 is overlapped with at least a portion of the auxiliary electrode AE.

The connection member 140 protrudes above an upper surface of the second electrode layer EL2 toward the second substrate 130. The connection member 140 makes contact with the second substrate 130. In this case, since the second substrate 130 is an insulating substrate, the connection member 140 is electrically insulated from, e.g., by, the second substrate 130.

The connection member 140 penetrates through the organic layer OL and the second electrode layer EL2. The connection member 140 makes contact with the second substrate 130 at the upper side thereof, and makes contact with the auxiliary electrode AE at the lower side thereof. The connection member 140 is electrically connected to the auxiliary electrode AE and electrically insulated from the second substrate 130.

The connection member 140 includes a conductive material to electrically connect the second electrode layer EL2 and the auxiliary electrode AE. Accordingly, voltage flowing through the second electrode layer EL2 is substantially the same as the voltage flowing through the auxiliary electrode AE. Since the second electrode layer EL2 is connected to the auxiliary electrode AE through the connection member 140, surface resistance of the second electrode layer EL2 is reduced, and thus a voltage drop phenomenon is prevented due to areas of the second electrode layer EL2. Thus, the display quality of the organic light emitting display device is improved.

The connection member 140 may have various shapes. For example, as illustrated in FIG. 4, the connection member 140 may be a conductive ball having a substantially spherical shape. In this case, since the conductive ball makes contact with a layer in point contact form, e.g., a conductive ball may have a single point of contact with a planar layer at a tangent point, the conductive ball may easily burrow, e.g., push, into the layer making contact with the conductive ball when an external pressure is applied to the conductive ball. However, embodiments are not limited thereto.

The connection member 140 having the spherical shape may make contact with the auxiliary electrode AE in point or surface contact form. FIG. 4 shows a contact surface CT-S formed by the connection member 140 having the spherical shape making contact with the auxiliary electrode AE in surface contact form.

Since the connection member 140 has a spherical shape, the contact surface CT-S has a substantially circular shape in a plan view. As an area of the contact surface CT-S increases in a plan view, the electrical connection between the auxiliary electrode AE and the second electrode layer EL2 is improved and the surface resistance of the second electrode layer EL2 is reduced.

The connection member 140 may be provided in a plural number. When the second opening portion $OP_{NX}$ is provided in a plural number, one or more connection members 140 are disposed to correspond to each second opening portion $OP_{NX}$. When the connection member 140 is disposed in the second opening portion $OP_{NX}$, the connection member 140 is automatically aligned on the auxiliary electrode AE without exerting influence on the adjacent light emitting areas.

FIGS. 5A to 5G illustrate cross-sectional views of stages in a method of manufacturing an organic light emitting display device according to an exemplary embodiment of the present disclosure. In FIGS. 5A to 5G, the same reference numerals denote the same elements in FIGS. 1 to 4, and thus detailed descriptions of the same elements will be omitted.

Referring to FIG. 5A, the first electrode layer EL1 is formed on the first substrate 110. The first electrode layer EL1 includes a plurality of conductive patterns spaced apart from each other. The conductive patterns include the first electrodes ED1 and the auxiliary electrode AE.

The first electrode layer EL1 may be formed through various processes and the processes are not particularly limited. The first electrodes ED1 and the auxiliary electrode AE may be substantially simultaneously formed.

For example, the first electrodes ED1 and the auxiliary electrode AE are formed by coating a base layer (not shown) formed of a conductive material on an entire surface of the first substrate 110, and patterning the base layer using a photolithography process. In another example, the first electrodes ED1 and the auxiliary electrode AE are formed by depositing the conductive material on the first substrate 110 using a mask (not shown).

The first electrodes ED1 and the auxiliary electrode AE may be sequentially formed. In this case, the first electrodes ED1 and the auxiliary electrode AE include the same material or different materials.

Figure 5B:
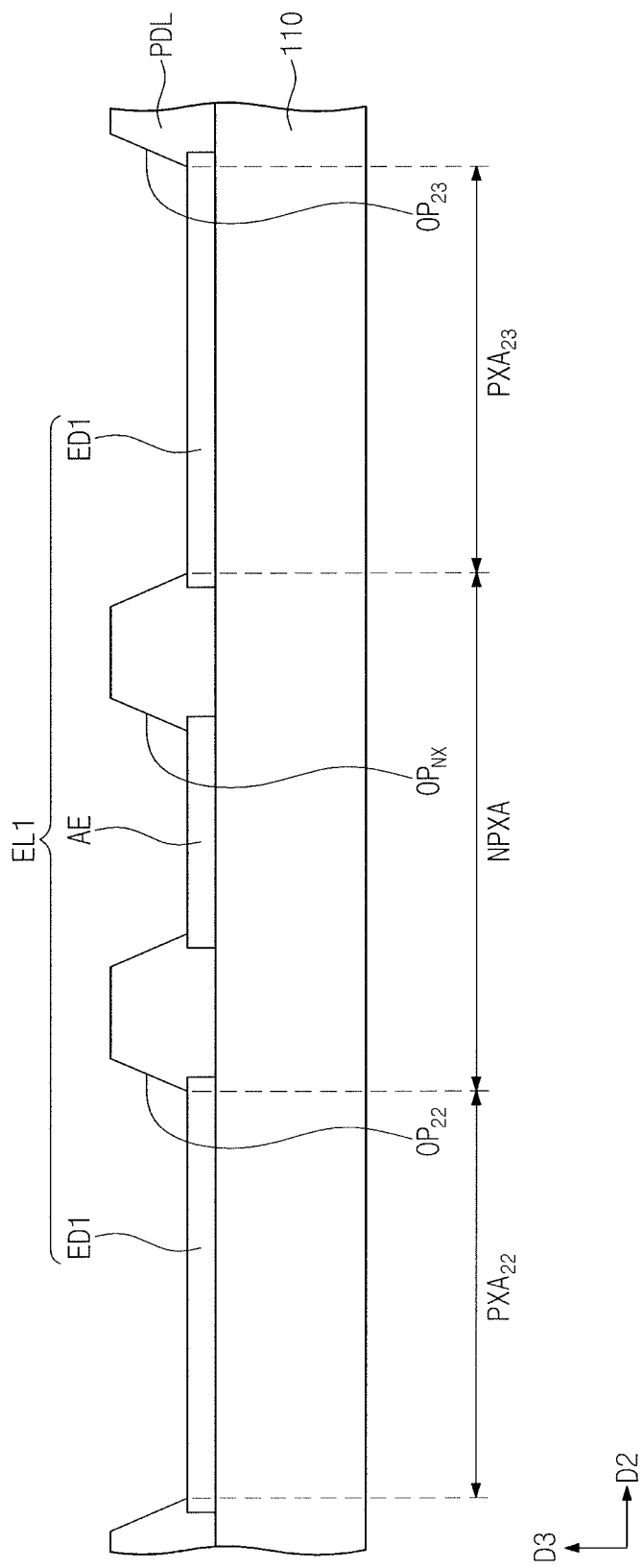

Referring to FIG. 5B, the pixel definition layer PDL is formed on the first substrate 110. A base layer (not shown) including an insulating material is formed on the first substrate 110, and the base layer is patterned by using a photolithography process.

During the patterning process, the opening portions are formed through the base layer to form the pixel definition layer PDL. The opening portions include the first opening portions $OP_{22}$ and $OP_{23}$ respectively overlapped with the first electrodes ED1 and at least one second opening portion $OP_{NX}$ overlapped with the auxiliary electrode AE.

The first opening portions $OP_{22}$ and $OP_{23}$ define the light emitting areas $PXA_{22}$ and $PXA_{23}$ and the non-light emitting area NPXA. Each of the first opening portions $OP_{22}$ and $OP_{23}$ exposes at least a portion of a corresponding first electrode of the first electrodes ED1, which is overlapped therewith.

The second opening portion $OP_{NX}$ is defined in the non-light emitting area NPXA. The second opening portion $OP_{NX}$ exposes at least a portion of the auxiliary electrode AE overlapped therewith.

Figure 5C:
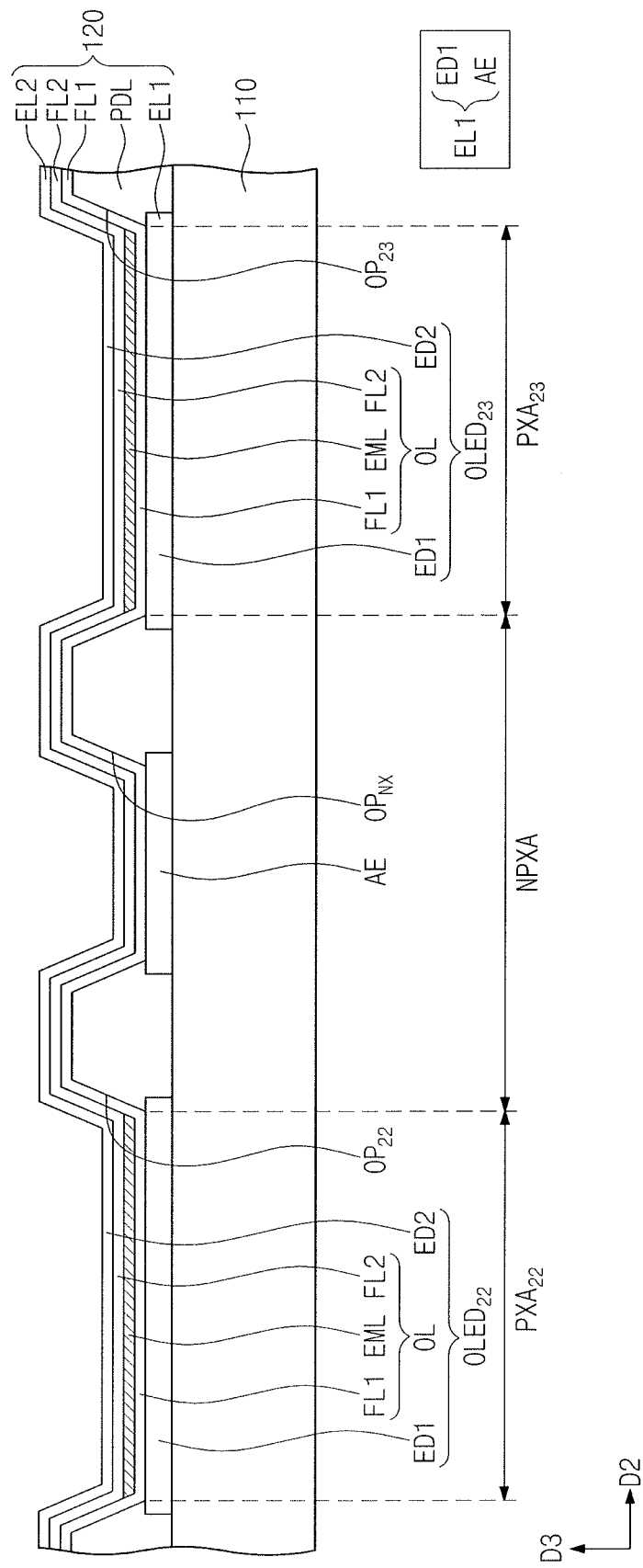

Referring to FIG. 5C, the organic layer OL and the second electrode layer EL2 are sequentially formed on the first electrode layer EL1. The organic layer OL includes the light emitting patterns EML, the hole transport region FL1, and the electron transport region FL2.

The light emitting patterns EML are formed by patterning the organic material using a mask to overlap with the first opening portions $OP_{22}$ and $OP_{23}$. In this case, the light emitting patterns EML may be formed in the first opening portions $OP_{22}$ and $OP_{23}$ using materials to generate lights having different colors according to the first opening portions $OP_{22}$ and $OP_{23}$.

The light emitting patterns EML are formed through various methods e.g., a vacuum depositing method, a spin coating method, a casting method, a Langmuir-Blodgett method, an inkjet printing method, a laser printing method, a laser induced thermal imaging (LITI) method, etc. The method forming the light emitting patterns EML is not limited to the above examples.

The hole transport region FL1 is formed between the first electrode layer EL1 and the light emitting patterns EML. The hole transport region FL1 is formed through various methods, e.g., a vacuum depositing method, a spin coating method, a casting method, a Langmuir-Blodgett method, an inkjet printing method, a laser printing method, a laser induced thermal imaging (LITI) method, etc. The method forming the hole transport region FL1 is not limited to the above examples.

The electron transport region FL2 is formed between the second electrode layer EL2 and the light emitting patterns EML. The electron transport region FL2 is formed through various methods, e.g., a vacuum depositing method, a spin coating method, a casting method, a Langmuir-Blodgett method, an inkjet printing method, a laser printing method, a laser induced thermal imaging (LITI) method, etc. The method forming the electron transport region FL2 is not limited to the above examples Each of the hole transport region FL1 and the electron transport region FL2 is integrally formed in a single unitary and individual unit to connect the light emitting areas PXA$_{22}$ and PXA$_{23}$. Each of the hole transport region FL1 and the electron transport region FL2 is overlapped with the light emitting areas PXA$_{22}$ and PXA$_{23}$ and the non-light emitting area NPXA. Accordingly, each of the hole transport region FL1 and the electron transport region FL2 is formed on the auxiliary electrode AE disposed in the non-light emitting area NPXA.

The second electrode layer EL2 is formed on the organic layer OL. The second electrode layer EL2 is formed by depositing the conductive material on the organic layer OL. The second electrode layer EL2 is integrally formed in a single unitary and individual unit to cover the light emitting areas PXA$_{22}$ and PXA$_{23}$ and the non-light emitting area NPXA.

Figure 5D:
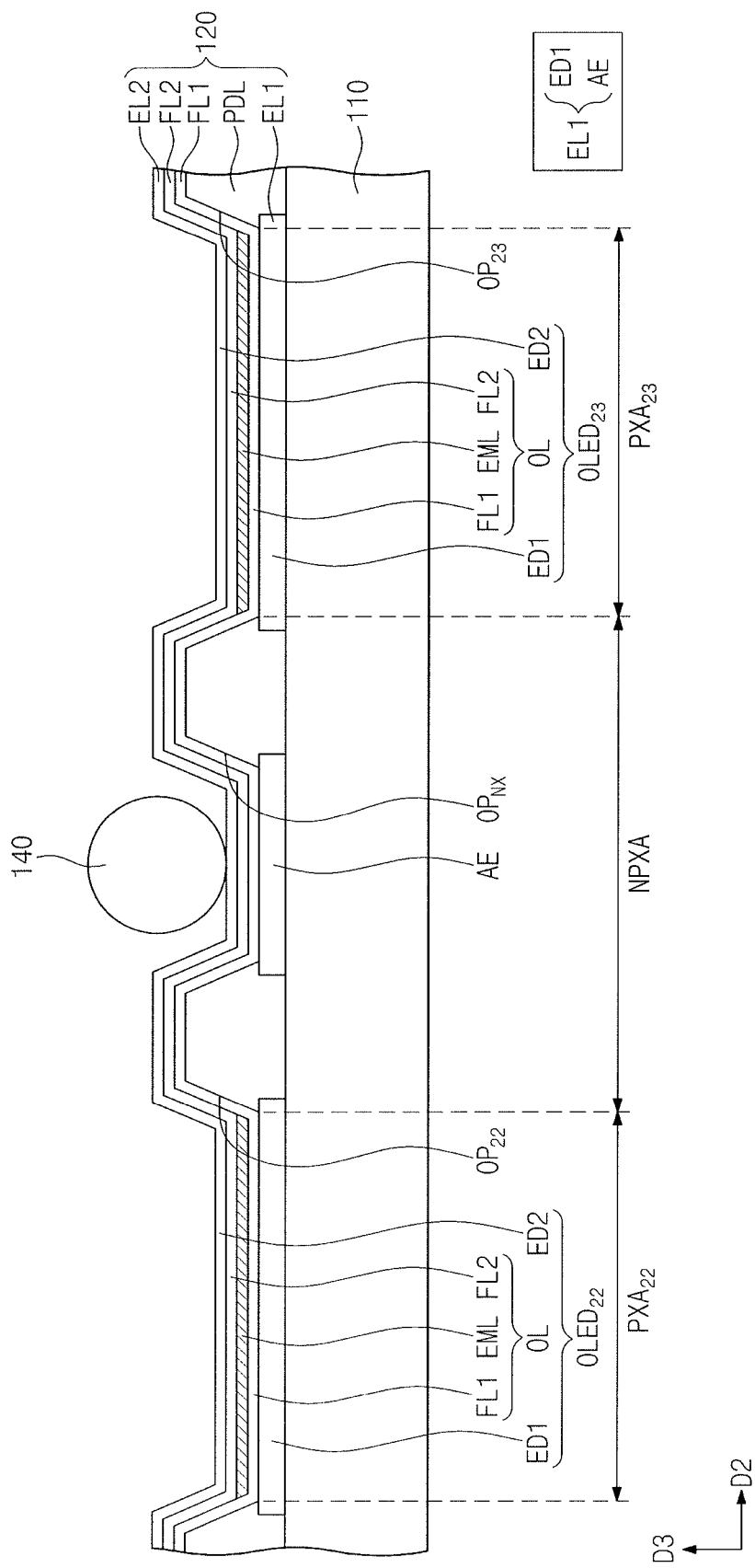

Referring to FIG. 5D, the connection member 140 is formed on the second electrode layer EL2. The connection member 140 may be disposed on the second electrode layer EL2 after being separately formed.

The connection member 140 may have various shapes. The connection member 140 has a shape to allow the contact area between the connection member 140 and the second electrode layer EL2 to become small when the connection member 140 is disposed on the second electrode layer EL2, e.g., the connection member 140 may be a conductive ball having a spherical shape.

As the connection member 140 is positioned in the second opening portion OP$_{NX}$ defined by the pixel definition layer PDL, the movement of the connection member 140 is prevented, e.g., restricted, by the pixel definition layer PDL, even though the connection member 140 has a spherical shape. Thus, influences exerted on the light emitting areas PXA$_{22}$ and PXA$_{23}$, e.g., caused by a connection member entering adjacent the light emitting areas PXA$_{22}$ and PXA$_{23}$ when not secured by the pixel definition layer PDL, may be reduced.

The connection member 140 may be provided in a plural number, and the connection members 140 may be regularly or irregularly arranged in the non-light emitting area NPXA. In addition, the plural connection members 140 may be arranged in corresponding second opening portions OP$_{NX}$.

The connection member 140 is automatically aligned on the auxiliary electrode AE, as long as the second opening portion OP$_{NX}$ is formed to overlap with the auxiliary electrode AE. Since the second opening portion OP$_{NX}$ is substantially and simultaneously formed together with the pixel definition layer PDL, the manufacturing method of the organic light emitting display device according to the present exemplary embodiment does not require a process of aligning the connection member 140 on the auxiliary electrode AE. It is enough that the connection member 140 is disposed above the second electrode layer EL2 to overlap with the auxiliary electrode AE.

Figure 5E:
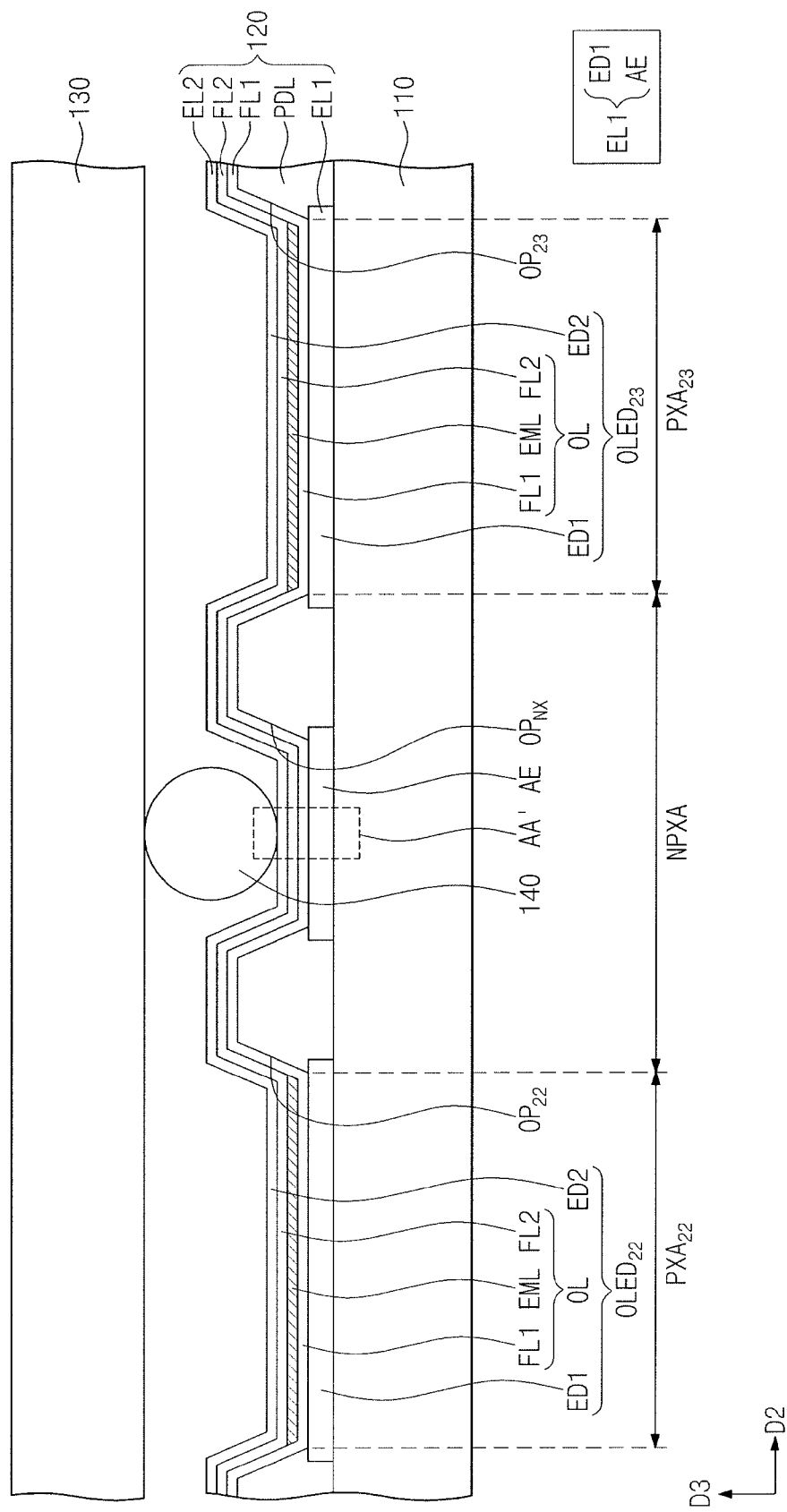
Figure 5G:
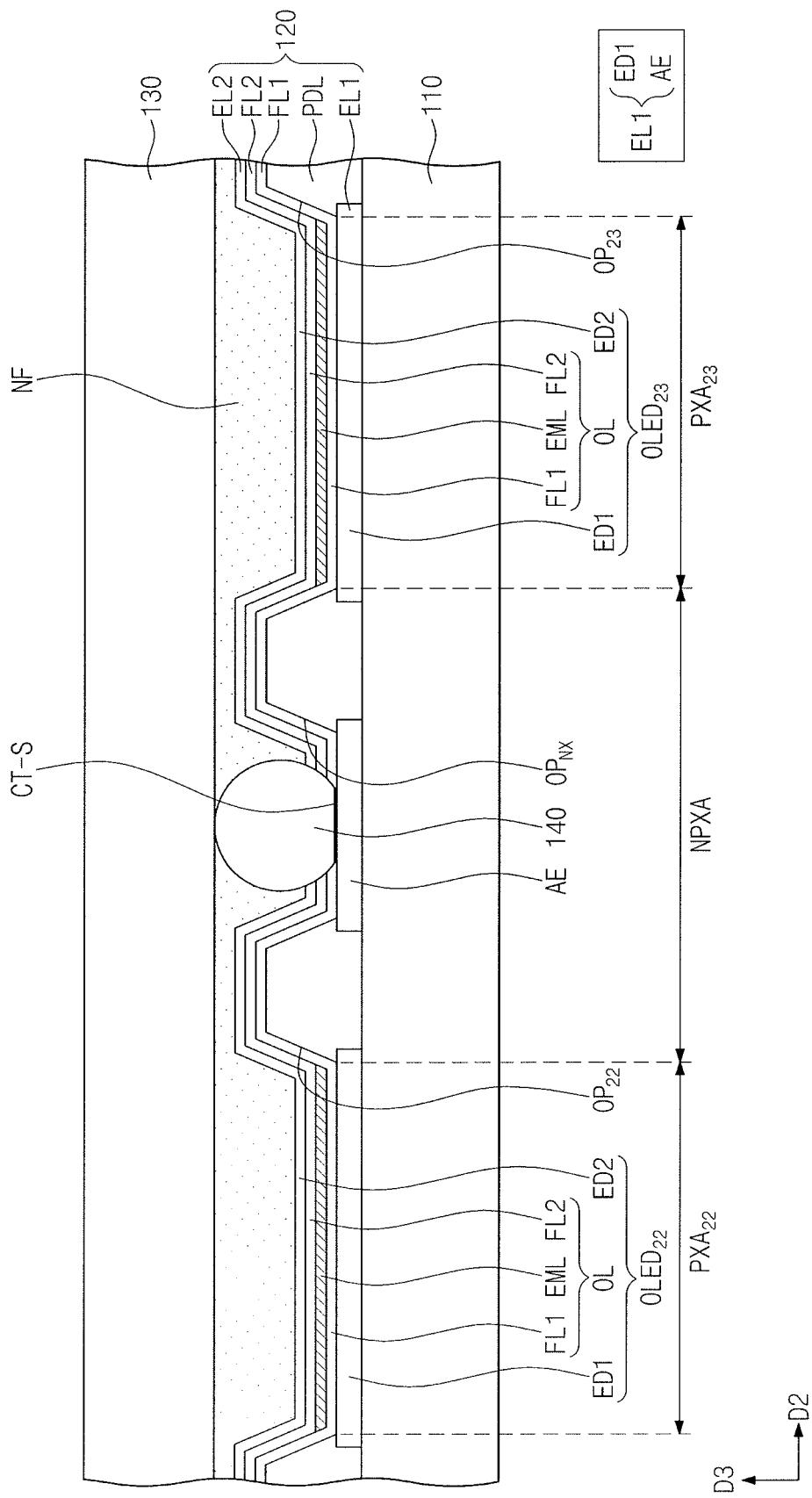

Referring to FIGS. 5E to 5G, the second substrate 130 is disposed above the first substrate 110. FIG. 5E illustrates the alignment of the second substrate 130 on the first substrate 110.

The second substrate 130 is spaced apart from the device layer 120, and makes contact with the connection member 140 in a cross-sectional view. Accordingly, a maximum height in the cross-sectional view of the connection member 140 corresponds to a length sufficient to allow the second substrate 130 to be spaced apart from the second electrode layer EL2.

At this stage, an external pressure applied to the connection member 140 through the second substrate 130 is substantially zero. That is, the second substrate 130 shown in FIG. 5E is aligned on the first substrate 110 to contact the connection member 140, without applying pressure to the connection member 140. Therefore, the connection member 140 makes contact with the second electrode layer EL2 in point contact form in the contact area AA'.

Next, referring to FIG. 5F, pressure PP is applied to the second substrate 130 to allow the connection member 140 to be electrically connected to the first electrode layer EL1. That is, the connection member 140 burrows into, e.g., penetrates through, the second electrode layer EL2 and the organic layer OL due to the pressure PP provided by the second substrate 130 in order to contact the auxiliary electrode AE.

The second electrode layer EL2 is formed to have a thickness thinner than signal lines, e.g., the gate lines GL1 to GLn (refer to FIG. 1), the data lines DL1 to DLm (refer to FIG. 1), to secure a transparency. In addition, a bonding force between molecules of the organic material is weaker than that of the electrode layer having a metallic bonding.

Accordingly, the connection member 140 sequentially penetrates through the second electrode layer EL2 and the organic layer OL due to the pressure PP applied thereto in a contact area AA'-1. The connection member 140 makes contact with the auxiliary electrode AE after penetrating through the second electrode layer EL2, the hole transport region FL1, and the electron transport region FL2. The connection member 140 is electrically connected to the auxiliary electrode AE. Consequently, the second electrode layer EL2 is electrically connected to the auxiliary electrode AE through the connection member 140, and thus the surface resistance of the second electrode layer EL2 having the thin thickness is reduced.

The connection member 140 makes contact with the auxiliary electrode AE in point or surface contact form. As shown in FIG. 5F, when the connection member 140 makes contact with the auxiliary electrode AE in surface contact form, the contact surface CT-S is formed.

The contact surface CT-S has a circular shape in a plan view. Since the connection member 140 has a spherical shape, the area of the contact surface CT-S increases as the pressure PP increases. Thus, the second electrode layer EL2 may easily contact the auxiliary electrode AE.

Although the second electrode layer EL2 makes contact with the auxiliary electrode AE by the pressure PP, the second substrate 130 is spaced apart from the second electrode layer EL2. Therefore, the pressure PP is determined to have a range equal to or higher than a pressure level sufficient to allow the connection member 140 to reach the auxiliary electrode AE after penetrating through the second electrode layer EL2 and the organic layer OL, and equal to or lower than a pressure level such that the second substrate 130 is spaced apart from the second electrode layer EL2 and the gap exists between the second electrode layer EL2 and the second substrate 130.

According to the manufacturing method of the organic light emitting display device, the second electrode layer EL2 may be electrically connected to the auxiliary electrode AE, even though a process of forming a contact hole is omitted. When the connection member 140 is disposed in the non-light emitting area NPXA and the pressure is applied to the connection member 140, the connection member 140 may easily contact the auxiliary electrode AE.

Accordingly, the connection member 140 is automatically aligned on the auxiliary electrode AE by the second opening portion OP$_{NX}$ and the pixel definition layer PDL. In addition, since the connection member 140 burrows into the second electrode layer EL2 and the organic layer OL by the pressure PP and makes contact with the auxiliary electrode AE, the process of forming the contact hole through the organic layer OL is omitted. Therefore, the manufacturing method of the organic light emitting display device is simplified and a yield of the organic light emitting display device is improved.

Referring to FIG. 5G, the second substrate 130 is coupled to the first substrate 110 to form the display panel DP. Although not shown in figures, a sealing member is coated along an edge of the first substrate 110 between the first and second substrates 110 and 130, and the sealing member is cured to couple the first and second substrates 110 and 130.

The gap between the first and second substrates 110 and 130 is determined by a height of the sealing member. The filling agent NF is filled in the space between the first and second substrates 110 and 130. The filling agent NF absorbs inner moisture and prevents foreign contaminant from entering the organic layer OL. Therefore, although the organic layer OL is exposed by the connection member 140, the organic layer OL may be prevented from being damaged due to the foreign contaminant.

The first and second substrates 110 and 130 are coupled to each other in various methods. For instance, the second substrate 130 is aligned on the first substrate 110, after the sealing member is disposed on the first substrate, or the first and second substrates 110 and 130 are coupled to each other by coating and curing the sealing member between the first and second substrates 110 and 130 after the connection member 140 is connected to the auxiliary electrode AE. The first and second substrates 110 and 130 are coupled to each other in any other methods which are not limited to the above examples.

The sealing member is cured by using light or heat. In addition, a portion of the sealing member is partially cured, and then completely cured after the filling agent is filled into between the first and second substrates 110 and 130.

By way of summary and review, in a front surface light emitting type organic light emitting display device, an amount of the light traveling to the outside increases as a thickness of the second electrode decreases, and thus a display quality of the front surface light emitting type organic light emitting display device is improved. Accordingly, the second electrode includes a transparent conductive material and is required to have a thin thickness. However, as the thickness of the second electrode decreases, an electric resistance of the second electrode increases. As a result, an electrical conductivity of the second electrode is lowered, and the display quality of the organic light emitting display device is deteriorated.

Therefore, according to embodiments, an organic light emitting display device includes a connection member penetrating through the second electrode layer and the organic layer to electrically connect the second electrode layer and the auxiliary electrode. The connection member contacts the auxiliary electrode after penetrating through the second electrode layer due an external pressure applied thereto. As such, the surface resistance of the second electrode layer is reduced without a contact hole, and thus the display quality of the organic light emitting display device is improved.

In addition, the organic light emitting display device includes the pixel definition layer provided with the opening portion formed therethrough to expose at least a portion of the auxiliary electrode in the non-light emitting area. The connection member is disposed in the opening portion defined in the non-light emitting area. As the opening portion is overlapped with the auxiliary electrode, and the connection member is disposed in the opening portion, the connection member is automatically aligned on the auxiliary electrode.

Further, the connection member is electrically connected to the auxiliary electrode by an external pressure applied to the second substrate. The second substrate applied the external pressure thereto push the connection member down so that the connection member penetrates a plurality of organic layers. Therefore, a process of forming the contact hole required to electrically connect the second electrode layer to the auxiliary electrode is omitted, and thus the manufacturing process of the organic light emitting display device is simplified and the yield of the light emitting display device is improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
   a first substrate;
   a first electrode layer including a plurality of first electrodes and an auxiliary electrode on the first substrate, the auxiliary electrode being spaced apart from the first electrodes in a plan view;
   an organic layer on the first electrode layer, the organic layer overlapping the first electrodes of the first electrode layer;
   a second electrode layer on the first electrode layer, the second electrode layer overlapping the first electrodes and the auxiliary electrode of the first electrode layer;
   a second substrate on the second electrode layer; and
   a connection member penetrating through the second electrode layer and through the organic layer to electrically connect the second electrode layer and the auxiliary electrode, the connection member contacting the second substrate,
   wherein the connection member has a substantially spherical shape.

2. The organic light emitting display device as claimed in claim 1, wherein the connection member contacts the auxiliary electrode.

3. The organic light emitting display device as claimed in claim 1, further comprising a pixel definition layer between the first substrate and the second substrate, the pixel definition layer having a plurality of opening portions spaced apart from each other in a plan view, and the opening portions include:
   a plurality of first opening portions respectively exposing at least portions of the first electrodes; and
   a second opening portion spaced apart from the first opening portions in a plan view, the second opening portion exposing at least a portion of the auxiliary electrode, and the connection member being in the second opening portion.

4. The organic light emitting display device as claimed in claim 3, wherein each of the connection member and the second opening portion is provided in a plural number, and one or more connection members are disposed in each of the second opening portion.

5. The organic light emitting display device as claimed in claim 3, wherein the first opening portions are arranged in a matrix form, and the second opening portion is disposed between the first portions to have a lattice shape in a plan view.

6. The organic light emitting display device as claimed in claim 1, wherein the organic layer includes:
   a hole transport region overlapping with the first electrodes and the auxiliary electrode;
   a plurality of light emitting patterns respectively overlapping with the first electrodes; and
   an electron transport region overlapping with the first electrodes and the auxiliary electrode, and the connection member penetrates through at least one of the hole transport region and the electron transport region and the connection member is spaced apart from the light emitting patterns in a plan view.

7. The organic light emitting display device as claimed in claim 1, wherein the first electrodes receive a first source voltage, and the auxiliary electrode receives a second source voltage different from the first source voltage.

8. The organic light emitting display device as claimed in claim 7, wherein the auxiliary electrode includes a substantially same material as the first electrodes.

9. The organic light emitting display device as claimed in claim 1, further comprising:
   a sealing member disposed between the first substrate and the second substrate along an edge of the second substrate to couple the first substrate and the second substrate; and
   a filler interposed between the first substrate and the second substrate.

10. A method of manufacturing an organic light emitting display device, the method comprising:
   providing a first substrate including a plurality of light emitting areas and a non-light emitting area disposed adjacent to the light emitting areas;
   forming a plurality of first electrodes respectively disposed in the light emitting areas of the first substrate and at least one auxiliary electrode disposed in the non-light emitting area of the first substrate;
   forming a pixel definition layer on the first substrate to expose at least a portion of each of the first electrodes and the auxiliary electrode;
   forming an organic layer on the first substrate;
   forming a second electrode on the organic layer;
   disposing a connection member on the second electrode to overlap with the non-light emitting area, the connection member being a conductive ball;
   disposing a second substrate above the second electrode;
   pressurizing the second substrate to allow the connection member to electrically contact the auxiliary electrode; and
   coupling the first substrate and the second substrate.

11. The method as claimed in claim 10, wherein forming the pixel definition layer includes:
   forming an insulating layer on the first substrate to cover the first electrodes and the auxiliary electrode; and
   forming first opening portions through the insulating layer to expose the first electrodes and a second opening portion through the insulating layer to expose the auxiliary electrode, the connection member being in the second opening portion.

12. The method as claimed in claim 10, wherein the connection member is pressurized by the second substrate, and a height in a cross-sectional view of the connection member, after the connection member is pressurized by the second substrate, is equal to or smaller than a height in the cross-sectional view of the connection member before the connection member is pressurized by the second substrate.

13. The method as claimed in claim 10, wherein forming the organic layer includes:
   forming a hole transport region on the first electrodes;
   forming a plurality of light emitting patterns on the hole transport region to respectively overlap with the light emitting areas; and
   forming an electron transport region on the light emitting patterns and the hole transport region, the connection member is disposed to be spaced apart from the light emitting patterns in a plan view, and the connection member penetrates through at least one of the hole transport region and the electron transport region by the pressurization of the second substrate to contact the auxiliary electrode.

14. An organic light emitting display device, comprising:
   a first substrate;
   a first electrode layer including a plurality of first electrodes and an auxiliary electrode on the first substrate, the auxiliary electrode being spaced apart from the first electrodes in a plan view;
   an organic layer on the first electrode layer, the organic layer overlapping the first electrodes of the first electrode layer;
   a second electrode layer on the first electrode layer, the second electrode layer overlapping the first electrodes and the auxiliary electrode of the first electrode layer; and
   a connection member penetrating through the organic layer to electrically connect the second electrode layer and the auxiliary electrode,
   wherein the connection member is provided in a plural number, one or more connection members being on each auxiliary electrode, and
   wherein the first electrodes receive a first source voltage, and the auxiliary electrode receives a second source voltage different from the first source voltage.

* * * * *